(12) United States Patent
Tamasato

(10) Patent No.: US 10,445,439 B2
(45) Date of Patent: Oct. 15, 2019

(54) CONSTRUCTION DESIGN SUPPORT APPARATUS AND CONSTRUCTION DESIGN SUPPORT METHOD FOR PHOTOVOLTAIC POWER GENERATION FACILITIES

(71) Applicant: TOTALMASTERS CORPORATION, Mie (JP)

(72) Inventor: Yoshinao Tamasato, Mie (JP)

(73) Assignee: TOTALMASTERS CORPORATION, Mie (JP)

( * ) Notice: Subject to any disclaimer, the term of this patent is extended or adjusted under 35 U.S.C. 154(b) by 0 days.

(21) Appl. No.: 16/248,784

(22) Filed: Jan. 16, 2019

(65) Prior Publication Data

US 2019/0251208 A1 Aug. 15, 2019

Related U.S. Application Data

(63) Continuation of application No. PCT/JP2018/004557, filed on Feb. 9, 2018.

(51) Int. Cl.
*H02S 10/00* (2014.01)
*G06F 17/50* (2006.01)
(Continued)

(52) U.S. Cl.
CPC .......... *G06F 17/5004* (2013.01); *H02S 10/00* (2013.01); *H02S 20/10* (2014.12); *H02S 99/00* (2013.01)

(58) Field of Classification Search
CPC ...... G06F 17/5004; H02S 10/00; H02S 99/00; H02S 20/10
(Continued)

(56) References Cited

U.S. PATENT DOCUMENTS

| 9,716,194 B2 * | 7/2017 | Yang | ................. H01L 31/03529 |
| 2015/0088440 A1 * | 3/2015 | Chen | ...................... H02S 50/10 |
| | | | 702/60 |

(Continued)

FOREIGN PATENT DOCUMENTS

| JP | 2016-122408 A | 7/2016 |
| JP | 2016-151952 A | 8/2016 |

(Continued)

OTHER PUBLICATIONS

Notice of Allowance in JP Application No. 2018-536226, dated Aug. 31, 2018, 6pp.

*Primary Examiner* — Juan C Ochoa
(74) *Attorney, Agent, or Firm* — Hauptman Ham, LLP

(57) ABSTRACT

A construction design support apparatus has: an input data acquisition unit; a temporary design unit that creates a plurality of pieces of temporary development surface data and creates temporary panel arrangement data for each piece of the temporary development surface data; a calculation unit that calculates a point value of a development amount for each piece of temporary development surface data and calculates a point value of a cumulative power generation amount for each piece of temporary panel arrangement data; and an extraction unit that extracts a combination of pieces of the temporary development surface data and the temporary panel arrangement data in which the point value of the development amount and the point value of the cumulative power generation amount match a predetermined evaluation condition.

5 Claims, 5 Drawing Sheets

(51) Int. Cl.
 *H02S 99/00* (2014.01)
 *H02S 20/10* (2014.01)
(58) Field of Classification Search
 USPC .......................................... 703/2, 1
 See application file for complete search history.

(56) References Cited

U.S. PATENT DOCUMENTS

2015/0331972 A1    11/2015  McClure et al.
2019/0068118 A1*    2/2019  Lee ..................... H02S 50/00

FOREIGN PATENT DOCUMENTS

JP        2017-45163 A    3/2017
JP        2017-174175 A   9/2017

* cited by examiner

CONSTRUCTION DESIGN SUPPORT APPARATUS AND CONSTRUCTION DESIGN SUPPORT METHOD FOR PHOTOVOLTAIC POWER GENERATION FACILITIES

CROSS-REFERENCE TO RELATED APPLICATIONS

The present application is a continuation application of International Application No. PCT/JP2018/004557, filed on Feb. 9, 2018. The contents of this application are incorporated herein by reference in its entirety.

TECHNICAL FIELD

The present invention relates to an apparatus, a method, and a program for supporting construction design of photovoltaic power generation facilities, such as site development and the arrangement of panels.

BACKGROUND

Photovoltaic power generation is becoming widespread as a measure to counter global warming. Meanwhile, there has been a trend in recent years to curb power sales prices of photovoltaic power generation. This requires photovoltaic power generation facilities that are at a low cost and generate much electric power. The amount of power generation is affected not only by the conversion efficiency of photovoltaic panels but also by the installation angle (inclination angle and azimuth angle) and the installation position of each photovoltaic panel. Specifically, the elevation angle (altitude) and the azimuth angle of the sun vary depending on the time and the season, and the amount of solar radiation received by photovoltaic panels thus varies depending on the installation angle of each photovoltaic panel, thereby increasing or decreasing the amount of power generation. Tracking mounts have been known that are configured so that photovoltaic panels track the sun in response to changes in the elevation angle and the azimuth angle of the sun. Such tracking mounts are high in cost.

To increase the amount of power generation from fixed photovoltaic panels, design of the installation angle and the installation position is important. Conventionally, it is recommended that the azimuth angle of photovoltaic panels be due south in general. It is also recommended that the inclination angle of the photovoltaic panels be 5 to 40 degrees (an elevation angle of 85 to 50 degrees). The inclination angle of each photovoltaic panel is designed taking into account not only differences in elevation angle and azimuth angle of the sun due to differences in longitude and latitude of photovoltaic power generation facilities, but also the photovoltaic panels' mutual effect of shadows, the accumulation of snow or dust, and the strength of mounts against the wind, for example. More specifically, a single photovoltaic panel tends to receive more solar radiation in a case in which the inclination angle of photovoltaic panels is high (30 degrees (an elevation angle of 60 degrees), as an example) than in a case in which the inclination angle thereof is low (10 degrees (an elevation angle of 80 degrees), as an example), on average. The case in which the inclination angle is high also has the advantage of snow or dust being hard to accumulate. At the same time, photovoltaic panels cast shadows over other adjacent photovoltaic panels more easily in the case in which the inclination angle of the photovoltaic panels is high than in the case in which the inclination angle thereof is low. Two adjacent photovoltaic panels thus need to be widely spaced from each other. As a result, fewer photovoltaic panels may be installed, so that the amount of power generation ends up being decreased. Additionally, photovoltaic panels are more susceptible to the wind in the case in which the inclination angle of the photovoltaic panels is high than in the case in which the inclination angle thereof is low, which sometimes requires strong mounts and may be a factor in increasing the cost.

The amount of photovoltaic power generation is greatly affected by weather conditions. For example, photovoltaic panels receive less solar radiation when it is cloudy or rainy than when it is sunny. The conversion efficiency of photovoltaic panels tends to decrease as the air temperature is higher. Because power poles are often installed for photovoltaic power generation facilities, the power poles cast shadows over the photovoltaic panels, thereby decreasing the amount of power generation. In more recent years, fewer sites have been available that are sufficiently wide and flat and suitable for photovoltaic power generation facilities. Consequently, there is a need to install photovoltaic power generation facilities in relatively small sites, sites having irregular shapes, inclined sites such as intermontane regions, or undulating sites. In such a case, buildings such as warehouses, trees, and mountains around the photovoltaic power generation facilities, or undulations in the sites, for example, may cast shadows over photovoltaic panels, and become a factor in decreasing the amount of power generation. The shapes of the sites may limit the azimuth angle and the installation position of photovoltaic panels. For example, the azimuth angle of all or part of photovoltaic panels in a photovoltaic power generation facility is not due south in some cases. As described above, the amount of photovoltaic power generation depends on various natural conditions, siting conditions, and other conditions. Therefore, it is not easy to determine the optimum installation angle and installation position of photovoltaic panels.

To address the problem, a method has been known by which to calculate the amount of power generation by changing condition settings for the installation angle of photovoltaic panels and the incident amount of sunlight for each season or each time slot, and calculate annual power purchase cost on the basis of the calculated amount of power generation, and determine the installation angle of each photovoltaic panel on the basis of the calculated power purchase cost (see Patent Literature 1: Japanese Unexamined Patent Application Publication No. 2017-174175). Patent Literature 1 also discloses that the incident amount of sunlight is calculated taking into account the installation position at a point where a photovoltaic panel is installed, positional information including environmental information regarding the surrounding environment serving as a light shield, and the rate of fine weather, and that the amount of power generation is calculated. According to the method of Patent Literature 1, the installation angle of each photovoltaic panel is determined to reflect not only changes in the elevation angle and the azimuth angle of the sun but also some effect of weather conditions and the surrounding environment that casts shadows over the photovoltaic panels.

Mounting equipment, such as a mount, is used to install photovoltaic panels in a site at an installation angle thus designed. Even if the ground of the site is not flat, photovoltaic panels are installed at an installation angle as designed, by adjusting the height of the foundation or the length of the feet of the mount. In undulating sites or inclined sites such as intermontane regions, however, it may be difficult to install photovoltaic panels at an installation angle as designed even if the height of the foundation or the length of the feet of the mount are adjusted. In such a case, sites are developed. Although sites that are inclined but have flat slopes sometimes do not need developing, when the inclination angle of slopes is significantly high or when slopes face a direction significantly away from the south, sites may be developed. Through development, a ground that is uniformly level and flat is sometimes formed, and a plurality of flat grounds that are stepwise are formed other times. An inclined ground of which surface is flat is also formed in some cases.

Meanwhile, development increases the cost of photovoltaic power generation facilities. Even if development enables photovoltaic panels to be installed at an installation angle as designed and the maximum amount of power generation to be achieved, the cost of development may worsen profits contrarily. Thus, the cost of development as well as the amount of power generation need to be considered. To address the problem, a method has been known to acquire geographic data on a site via the Internet, estimate an undulation state of the site on the basis of the geographic data, regard the height intermediate between the highest portion of a convex part and the lowest portion of a concave part that are adjacent to each other as a datum line after development, calculate the amount of earth cutting and the amount of earth filling to level the site along the datum line, and calculate the cost of development from the amount of earth cutting and the amount of earth filling (see Patent Literature 2: Japanese Unexamined Patent Application Publication No. 2017-045163).

SUMMARY

Various exemplary embodiments of the present invention provide a construction design support apparatus for photovoltaic power generation facilities, the construction design support apparatus including: an input data acquisition unit configured to acquire input data including site data that includes positional data and topographic data on a site for a photovoltaic power generation facility that is an object to be designed, panel specifications data that includes data on power generation performance and dimensions of photovoltaic panels used in the photovoltaic power generation facility, sun direction data showing the direction of a sun on a time-series basis in the position of the site, and development requirements data that includes at least one of a development requirement for the allowable range of the inclination angle required of the site and a development requirement for the allowable range of the degree of undulation; a temporary design unit configured to create a plurality of pieces of temporary development surface data by performing, on the topographic data, processing equivalent to earth cutting and earth filling so as to satisfy the development requirements, and to create temporary panel arrangement data on the photovoltaic panels for each piece of the temporary development surface data; a calculation unit configured to calculate a point value of a development amount corresponding to amounts of earth cutting and earth filling for each piece of the temporary development surface data, and to calculate a point value of a cumulative power generation amount corresponding to a cumulative amount of power generated for a predetermined period for each piece of the temporary panel arrangement data; and an extraction unit configured to extract a combination of pieces of the temporary development surface data and the temporary panel arrangement data in which the point value of the development amount and the point value of the cumulative power generation amount match a predetermined evaluation condition.

In the aforementioned construction design support apparatus for photovoltaic power generation facilities, the point value of the development amount is a value corresponding to a development cost, the point value of the cumulative power generation amount is a value corresponding to an income from power sales, and the extraction unit may extract a combination of the temporary development surface data and the temporary panel arrangement data in which a difference value is maximum that is obtained by subtracting the point value of the development amount from the point value of the cumulative power generation amount.

In the aforementioned construction design support apparatus for photovoltaic power generation facilities, the point value of the development amount may be a value corresponding to a development cost, the point value of the cumulative power generation amount may be a value corresponding to an income from power sales, and the extraction unit may extract a combination of the temporary development surface data and the temporary panel arrangement data in which a difference value is zero that is obtained by subtracting the point value of the development amount from the point value of the cumulative power generation amount.

The aforementioned construction design support apparatus for photovoltaic power generation facilities may further have: an image data acquisition unit configured to acquire image data on the site for the photovoltaic power generation facility; and an image data processing unit configured to create topographic data on the site for the photovoltaic power generation facility, based on the image data, and the input data acquisition unit may be configured to acquire the topographic data created by the image data processing unit.

Further, various exemplary embodiments of the present invention provide a construction design support method and a construction design support program for photovoltaic power generation facilities that have the same structure as the aforementioned construction design support apparatus.

DETAILED DESCRIPTION

Figure 1:
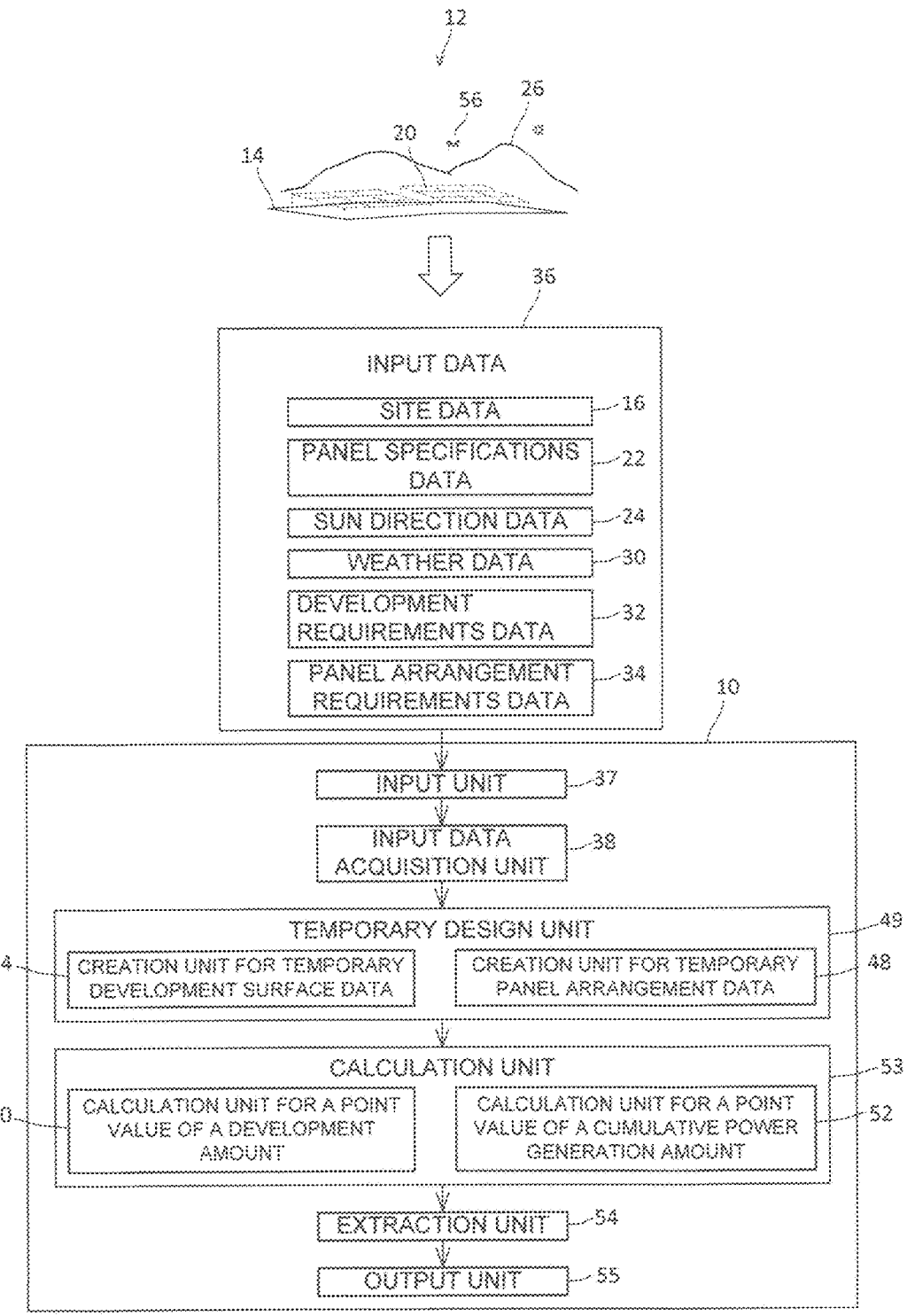
FIG. 1 is a block diagram schematically illustrating a structure of a construction design support apparatus for photovoltaic power generation facilities in accordance with a first embodiment of the present invention.
Figure 2:
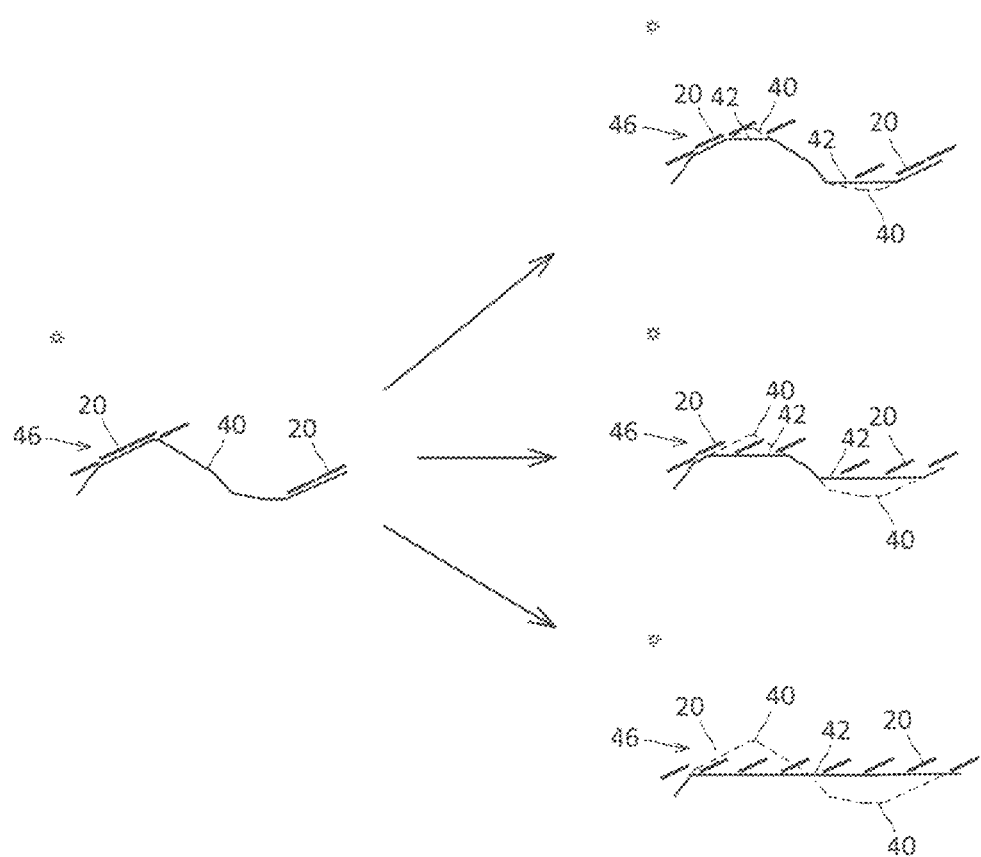
FIG. 2 is a side view schematically illustrating pieces of temporary development surface data and pieces of temporary panel arrangement data created by the construction design support apparatus.

FIG. 1 is a diagram illustrating a construction design support apparatus 10 for photovoltaic power generation facilities in accordance with a first embodiment of the present invention. FIG. 2 is a view schematically illustrating pieces of temporary development surface data 42 and pieces of temporary panel arrangement data 46 created by the construction design support apparatus. The construction design support apparatus 10 has: an input data acquisition unit 38 configured to acquire input data 36 including site data 16, which includes positional data, shape data, and topographic data 40 on a site 14 for a photovoltaic power generation facility 12 that is an object to be designed, and light shielding element data showing the shape and the position of a light shielding element 26 that blocks sunlight and casts a shadow over the site 14, panel specifications data 22 that includes data on the power generation performance and the dimensions of photovoltaic panels 20 used in the photovoltaic power generation facility 12, sun direction data 24 showing the direction of the sun on a time-series basis in the position of the site 14, time-series weather data 30 on an area corresponding to the site 14, development requirements data 32 that includes development requirements for both the allowable range of the inclination angle required of the site 14 and the allowable range of the degree of undulation, and panel arrangement requirements data 34 that includes the allowable range of the installation angle of the photovoltaic panels 20; a temporary design unit 49 that creates a plurality of pieces of temporary development surface data 42 by performing, on the topographic data 40 on the site 14, processing corresponding to earth cutting and earth filling so as to satisfy the development requirements, and that creates temporary panel arrangement data 46 on the photovoltaic panels 20 for each piece of the temporary development surface data 42 and the topographic data 40; a calculation unit 53 that calculates a point value of a development amount corresponding to earth cutting and earth filling for each piece of the temporary development surface data 42, and that calculates a point value of a cumulative power generation amount corresponding to the cumulative amount of power generated for a predetermined period for each piece of the temporary panel arrangement data 46; and an extraction unit 54 that extracts a combination of pieces of the temporary development surface data 42 (or the topographic data 40) and the temporary panel arrangement data 46 in which the point value of the development amount and the point value of the cumulative power generation amount match a predetermined evaluation condition.

The construction design support apparatus 10 is a computer or a computer system. The construction design support apparatus 10 includes a construction design support program for photovoltaic power generation facilities that causes the computer or the computer system to function as the input data acquisition unit 38, the temporary design unit 49, the calculation unit 53, and the extraction unit 54. The construction design support apparatus 10 also includes an input unit 37 for inputting the input data 36 and an output unit 55 for outputting the piece of temporary development surface data 42 (or topographic data 40) and the piece of temporary panel arrangement data 46 extracted by the extraction unit 54. A single computer may include the input unit 37, the input data acquisition unit 38, the temporary design unit 49, the calculation unit 53, the extraction unit 54, and the output unit 55. All or part of these units may be included in different computers connected through a network.

The photovoltaic power generation facility 12 is, for example, a power generation facility planned to be newly constructed. The positional data included in the site data 16 is the latitude and longitude of the site 14, for example. The shape data is data on the shape of the boundaries of the site 14. The topographic data 40 is three-dimensional data on the site 14 and the surrounding topography thereof. The light shielding element data is three-dimensional data on buildings, trees, undulations such as mountains, for example, and power poles in the site 14 and its surroundings. The topographic data 40 and the light shielding element data are created based on image data captured from the air by a drone 56, for example. Specifically, the position of a target point on an image can be identified as follows. The drone 56 first takes continuous images that include the target point while flying. From each image, the direction of the target point with respect to the position of the drone 56 can be identified. For a plurality of images, the position of the target point can be identified by identifying the direction of the target point with respect to the position of the drone 56. The distance between the target point and the position of the drone 56 can be obtained by laser radiation. In this case, the position of the target point can be identified from a single image. The position of the drone 56 and the direction of a camera built in the drone 56 can be identified using GNSS such as RTK, for example. The light shielding element data may also include three-dimensional data on power poles planned to be installed in the site 14, for example. The topographic data and the light shielding element data may be a part and another part of common three-dimensional data.

The panel specifications data 22 is data on the conversion efficiency, the rated output, the breadthwise and lengthwise dimensions, for example, of the photovoltaic panels 20 planned to be used in the photovoltaic power generation facility 12. The input data 36 may also include data on the conversion efficiency of a DC-AC inverter planned to be used in the photovoltaic power generation facility 12. The weather data 30 is data on the amount of solar radiation, the air temperature, weather conditions (such as sunny, cloudy, rainy, and snowy), and snow accumulation, for example. Weather data provided by a meteorological agency and NEDO (registered trademark), for example, can be used for the weather data. Data obtained at a meteorological observatory at which a weather close to that of the photovoltaic power generation facility 12 is observed are used for the weather data 30. For example, the data is data obtained at a meteorological observatory that is geographically close to the photovoltaic power generation facility 12. The allowable range of the inclination angle in the development requirements data 32 is an upper-limit inclination angle of a ground of the site 14 required by mounting equipment, such as a mount, that supports the photovoltaic panels 20 and a construction method of the foundation, for example. The allowable range of the degree of undulation is an upper limit of the level difference between the highest and lowest points of the site 14, for example. The allowable range of the degree of undulation may also be an upper limit of the level difference between the highest and lowest points within a range of given distance in the site 14. The development requirements may include an upper-limit amount of earth cutting, an upper-limit amount of earth filling, an upper limit of the difference between the amounts of earth cutting and earth filling, for example. The allowable range of the installation angle of the photovoltaic panels 20 in the panel arrangement requirements data 34 is allowable ranges of the azimuth angle and the inclination angle of the photovoltaic panels 20. The allowable range of the azimuth angle is, for example, an angular range to the east side and the west side being centered at due south. The allowable range of the inclination angle is, for example, 5 to 40 degrees (an elevation angle of 85 to 50 degrees). The panel arrangement requirements data 34 includes the allowable range of the installation height of the photovoltaic panels 20 from the ground. The allowable range of the height is selected as appropriate in accordance with mounting equipment, such as a mount, and snow accumulation of an area in which the site 14 is located, for example. The panel arrangement requirements data 34 may also include a predetermined clearance between adjacent photovoltaic panels 20 or the allowable range of the clearance. The predetermined clearance between adjacent photovoltaic panels 20 or the allowable range of the clearance is selected as appropriate, taking into account a shadow a photovoltaic panel 20 casts over an adjacent photovoltaic panel 20, for example.

The temporary design unit 49 has a creation unit 44 for temporary development surface data and a creation unit 48 for temporary panel arrangement data. The creation unit 44 for temporary development surface data creates a plurality of pieces of temporary development surface data 42 by performing, on the topographic data 40, earth cutting processing for cutting out a part that projects more than its surroundings and/or earth filling processing for placing fill in a part that is dented more than its surroundings, as illustrated in FIG. 2. The topographic data 40 and the temporary development surface data 42 are shown as positions in the X, Y, and Z coordinates of intersection points on a mesh separating a ground of the site 14 at regular spacing, for example. The reference point of the X, Y, and Z coordinates is a predetermined position in the site 14. The X direction and the Y direction are directions parallel to a horizontal surface (an east-west direction and a north-south direction, for example), and the mesh separates the ground of the site 14 at regular spacing in the X direction and the Y direction. The difference in Z elements (elements in the up-and-down direction) of intersection points on the mesh shows an undulation. Processing corresponding to earth cutting is performed by decreasing Z elements of intersection points on the mesh in the topographic data 40. Processing corresponding to earth filling is performed by increasing Z elements of intersection points on the mesh. The inclination angle of the ground is calculated from the difference in Z elements of intersection points adjacent to each other. In a case in which processing corresponding to both earth cutting and earth filling is performed, the difference in amounts of earth cutting and earth filling may be set to be smaller than a predetermined upper limit. The creation unit 44 for temporary development surface data creates many pieces of temporary development surface data 42 in which positions at which earth cutting and/or earth filling as described above are performed and degrees of earth cutting and/or earth filling are different.

The creation unit 48 for temporary panel arrangement data creates one or more pieces of temporary panel arrangement data 46 in which an installation angle (an azimuth angle and an inclination angle) and installation positions (for example, positions in the X, Y, and Z coordinates with reference to a predetermined position in the site 14, which are common to the aforementioned mesh) of a plurality of photovoltaic panels 20 arranged in the site 14 are identified for each piece of temporary development surface data 42 and topographic data 40. The installation angle is, for example, a predetermined angle at which the azimuth angle is due south and the inclination angle is in the range of 5 to 400 (300, as an example). A plurality of installation angles may also be selected at a predetermined spacing within the allowable range of the installation angle to create a plurality of pieces of temporary panel arrangement data 46. The installation positions in the XY direction (the horizontal direction) are identified so that as many photovoltaic panels 20 as possible can be arranged within the range of the site 14 (within the range of the shape data), for example. The photovoltaic panels 20 may be installed with a predetermined clearance left therebetween, taking into account a shadow each photovoltaic panel 20 casts over its adjacent photovoltaic panel 20, for example. A plurality of clearances may also be selected at a predetermined spacing in the allowable range of the clearance to create a plurality of pieces of temporary panel arrangement data 46. The installation positions in the Z direction (the up-and-down direction) are predetermined values within the allowable range of the installation height of the photovoltaic panels 20 from the ground, for example. A plurality of installation positions in the Z direction may also be selected at a predetermined spacing within the allowable range of the installation height to create a plurality of pieces of temporary panel arrangement data 46.

The calculation unit 53 has a calculation unit 50 for a point value of a development amount and a calculation unit 52 for a point value of a cumulative power generation amount. A point value of a development amount is a value corresponding to the development cost. A point value of a cumulative power generation amount is a value corresponding to the income from power sales. The calculation unit 50 for a point value of a development amount calculates a point value of the development amount corresponding to the development cost by multiplying, for example, the amounts of earth cutting and earth filling by a predetermined coefficient for each piece of temporary development surface data 42. The amounts of earth cutting and earth filling can be calculated as a difference between the temporary development surface data 42 and the topographic data 40. The predetermined coefficient is, for example, a unit price for work of earth cutting and earth filling in the area of the site 14 (construction cost/unit volume). The unit price may be a market price at the time of calculation, or may be an average value of market prices over the past few years. The unit price may also be a market price at the time of carrying out construction estimated from the foregoing. A coefficient by which the amount of earth cutting is multiplied may be a value different from a coefficient by which the amount of earth filling is multiplied. If there is a difference between the amounts of earth cutting and earth filling and the difference generates an additional cost, the difference may be further multiplied by another coefficient. If a predetermined basic cost is generated in addition to the cost calculated from the amounts of earth cutting and earth filling, the basic cost is added to the point value of the development amount. The point value of the development amount may be a specific amount of money, or may be a value corresponding to the amount of money (a value of multiplying the amount of money by a predetermined coefficient, for example). For the topographic data 40, the amounts of earth cutting and earth filling are zero, so that the point value of the development amount is zero.

The calculation unit 52 for a point value of a cumulative power generation amount calculates a point value of the cumulative power generation amount corresponding to the income from power sales of the photovoltaic power generation facility 12 by multiplying the cumulative amount of power generated by the photovoltaic power generation facility 12 for a predetermined period by a predetermined coefficient for each piece of temporary panel arrangement data 46. The predetermined period is, for example, 1 year, 3 years, 5 years, 10 years, 15 years, 20 years, or 30 years. The predetermined period is entered as input data, and the input data acquisition unit 38 acquires the data. The predetermined coefficient is, for example, a power sales unit price. Like the point value of the development amount, the point value of the cumulative power generation amount may be a specific amount of money, or may be a value corresponding to the amount of money (a value of multiplying the amount of money by a predetermined coefficient, for example). If the point value of the development amount is a specific amount of money, the point value of the cumulative power generation amount is also a specific amount of money. A projected value of the power generation amount is calculated on the basis of the installation angle and the number of installations of the photovoltaic panels 20 in each piece of temporary panel arrangement data 46, the sun direction data 24, the topographic data 40 and the light shielding element data included in the site data 16, the temporary development surface data 42, the weather data 30, the conversion efficiency of the photovoltaic panels 20, and the conversion efficiency of a DC-AC inverter. In a case in which a shadow a photovoltaic panel 20 casts over an adjacent photovoltaic panel 20 is taken into account, the effect of the shadow of the photovoltaic panel 20 is also reflected in a calculation result on the basis of the dimensions and the installation position of the photovoltaic panel 20.

The calculation unit 52 for a point value of a cumulative power generation amount may also be configured to calculate the amount of power generation from a learned model. Specifically, the learned model can be created by learning the relation between a plurality of sets of configuration data composed of reference data including site data that includes positional (the latitude and longitude) data, shape data, the topographic data 40 on sites of a large number of power generation facilities which are actually used or were actually used in the past, and light shielding element data showing the shape and the position of a light shielding element that blocks sunlight and casts a shadow over the sites, panel arrangement data that includes data on the installation angle and the installation position of reference photovoltaic panels installed in the sites, panel specifications data that includes data on the power generation performance of the reference photovoltaic panels, sun direction data showing the direction of the sun on a time-series basis in the position of the sites, time-series weather data that includes data on the amount of solar radiation in an area corresponding to the site, and time-series power generation data equivalent to the actual amount of power generated by reference photovoltaic power generation facilities, and data corresponding to the power generation data can be estimated from data corresponding to the reference data excluding the power generation data. Each piece of data included in the reference data is data converted to suit machine learning. If each piece of data included in the reference data suits machine learning without being converted, conversion is unnecessary. Using the learned model to process the installation angle and the installation position of the photovoltaic panels 20 in each piece of temporary panel arrangement data 46, the site data 16, the temporary development surface data 42, the panel specifications data 22, the sun direction data 24, the weather data 30, and the conversion efficiency of the DC-AC inverter enables the amount of power generation to be calculated with high accuracy. In this case, each piece of data is converted to suit processing using the learned model. If each piece of data suits machine learning without being converted, conversion is unnecessary.

The extraction unit 54 extracts a combination of pieces of the temporary development surface data 42 (or the topographic data 40) and the temporary panel arrangement data 46 in which a difference value is maximum that is obtained by subtracting the point value of the development amount from the point value of the cumulative power generation amount obtained in the manner described above. To extract a combination of pieces of the temporary development surface data 42 (or the topographic data 40) and the temporary panel arrangement data 46 that has higher profitability, pieces of temporary development surface data 42 and/or pieces of temporary panel arrangement data 46 are preferably large in number. A brute-force search (an exhaustive search), hill climbing, and simulated annealing, for example, can be used as a method to perform the aforementioned calculation for many combinations of pieces of the temporary development surface data 42 (or the topographic data 40) and the temporary panel arrangement data 46. Any of the methods may be selected as appropriate in accordance with the number of pieces of temporary development surface data 42, the number of pieces of temporary panel arrangement data 46, and the capacity of a computing machine, for example.

Figure 3:
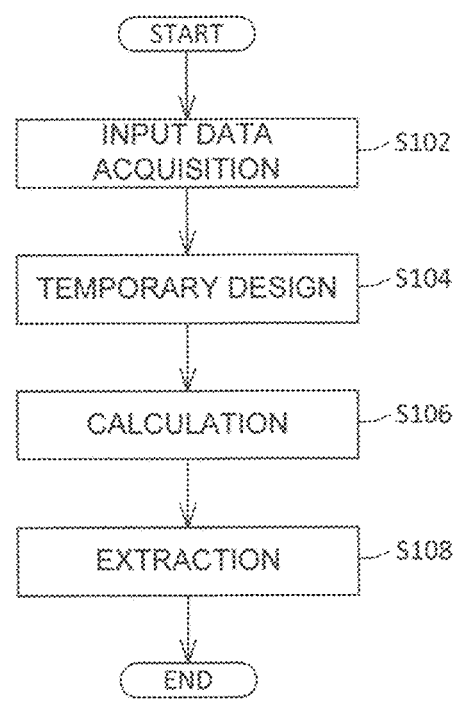
FIG. 3 is a flowchart of a construction design support method for photovoltaic power generation facilities that uses the aforementioned design support apparatus.

Next, a construction design support method for photovoltaic power generation facilities is described that uses the construction design support apparatus 10 (see FIG. 3). An operator first enters the input data 36 into the input unit 37, and the input data acquisition unit 38 acquires the input data 36 (S102: an input data acquisition step). The topographic data 40 and the light shielding element data are created based on image data captured from the air by the drone 56, for example. A predetermined upper limit of the difference in amounts of earth cutting and earth filling, a predetermined installation angle of the photovoltaic panels 20, a predetermined clearance between the photovoltaic panels 20 or the allowable range of the clearance, conversion efficiency of the DC-AC inverter, and a period for which the amount of power generation is calculated are also entered as the input data when needed, and the input data acquisition unit 38 acquires such data as well.

The temporary design unit 49 then creates the temporary development surface data 42 and the temporary panel arrangement data 46 (S104: a temporary design step). Specifically, the creation unit 44 for temporary development surface data creates a plurality of pieces of temporary development surface data 42 by performing, on the topographic data 40, processing equivalent to earth cutting and/or earth filling so as to satisfy the development requirements (a step of creating temporary development surface data). In a case in which an upper limit of the difference in amounts of earth cutting and earth filling is entered as the input data, a plurality of temporary development surface data 42 are created so as to satisfy the requirements.

The creation unit 48 for temporary panel arrangement data then creates one or more pieces of temporary panel arrangement data 46 on the photovoltaic panels 20 for each piece of the temporary development surface data 42 and the topographic data 40 (a step of creating temporary panel arrangement data). The azimuth angle of the photovoltaic panels 20 is due south and the inclination angle is a predetermined angle in the range of 5 to 400 (300, as an example). A plurality of installation angles may also be selected at a predetermined spacing within the allowable range of the installation angle, for example. The installation positions in the XY direction (the horizontal direction) are identified so that as many photovoltaic panels 20 as possible can be arranged within the range of the site 14 (within the range of the shape data), for example. The photovoltaic panels 20 may be installed with a predetermined clearance left therebetween. A plurality of clearances may also be selected at a predetermined spacing in a predetermined allowable range of the clearance. The installation positions in the Z direction (the up-and-down direction) are predetermined values within the allowable range of the installation height of the photovoltaic panels 20 from the ground, for example. A plurality of installation positions in the Z direction may also be selected at a predetermined spacing within the allowable range of the installation height.

The calculation unit 53 then calculates a point value of a development amount and a point value of the cumulative power generation amount (S106: a calculation step). Specifically, the calculation unit 50 for a point value of a development amount calculates a value corresponding to the development cost by multiplying, for example, the amounts of earth cutting and earth filling by a predetermined coefficient such as a unit price for work (construction cost/unit volume) for each piece of temporary development surface data 42 (a step of calculating a point value of a development amount). If a predetermined basic cost is generated in addition to the cost calculated from the amounts of earth cutting and earth filling, the basic cost is added to the value corresponding to the development cost. For the topographic data 40, the amounts of earth cutting and earth filling are zero, so that the point value of the development amount is calculated to be zero.

The calculation unit 52 for a point value of a cumulative power generation amount then calculates a cumulative amount of power generated by the photovoltaic power generation facility 12 for a predetermined period for each piece of temporary panel arrangement data 46. Furthermore, the calculation unit 52 for a point value of a cumulative power generation amount calculates a point value of the cumulative power generation amount corresponding to the income from power sales of the photovoltaic power generation facility 12 by multiplying the cumulative amount of power generation by a predetermined coefficient (a step of calculating a point value of a cumulative power generation amount). The step of calculating a point value of a cumulative power generation amount may be performed at the same time as the step of calculating a point value of a development amount. The step of calculating a point value of a cumulative power generation amount may also be performed prior to the step of calculating a point value of a development amount.

The extraction unit 54 then extracts a combination of pieces of the temporary development surface data 42 (or the topographic data 40) and the temporary panel arrangement data 46 in which a difference value is maximum that is obtained by subtracting the point value of the development amount from the point value of the cumulative power generation amount obtained in the manner described above (S108: an extraction step). The extracted combination of pieces of the temporary development surface data 42 (or the topographic data 40) and the temporary panel arrangement data 46 is output to the output unit 55. For a brute-force search (an exhaustive search), an input data acquisition step S102, a temporary design step S104, a calculation step S106, and an extraction step S108 are performed once in this order, as illustrated in FIG. 3. For hill climbing and simulated annealing, the temporary design step S104 and the calculation step S106 are repeated a plurality of times.

Figure 4:
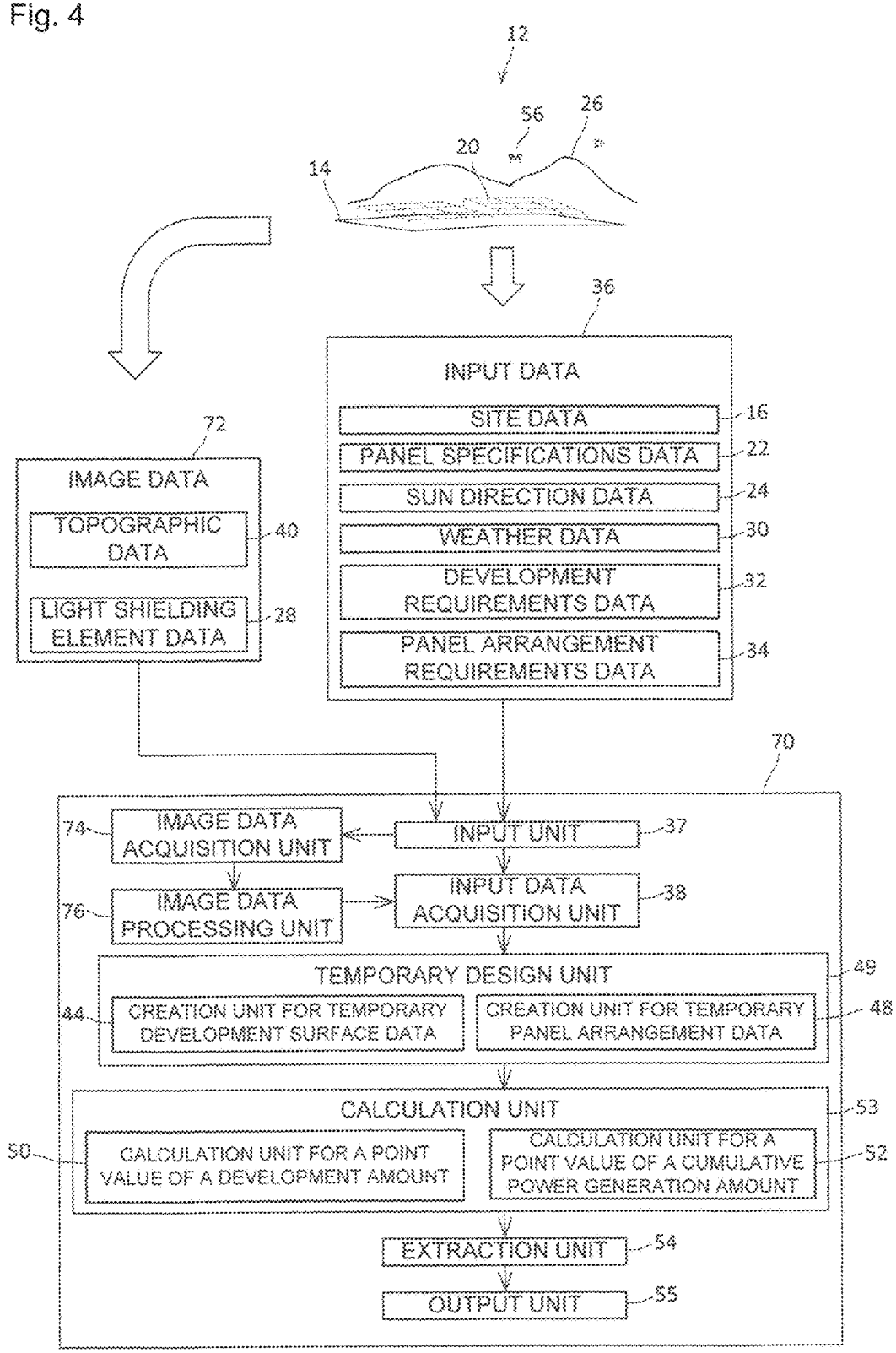
FIG. 4 is a block diagram schematically illustrating a structure of a construction design support apparatus for photovoltaic power generation facilities in accordance with a second embodiment of the present invention.

Next, a second embodiment of the present invention is described. FIG. 4 is a diagram illustrating a construction design support apparatus 70 for photovoltaic power generation facilities in accordance with the second embodiment. The construction design support apparatus 70 further has: an image data acquisition unit 74 configured to acquire image data 72 on the site 14 for the photovoltaic power generation facility 12 and its surroundings; and an image data processing unit 76 configured to create the topographic data 40 on the site 14 for the photovoltaic power generation facility 12 and light shielding element data 28 on the basis of the image data 72. The input data acquisition unit 38 is configured to acquire input data created by the image data processing unit 76. The construction design support apparatus 70 includes a construction design support program for photovoltaic power generation facilities that causes the computer or the computer system to function as the image data acquisition unit 74 and the image data processing unit 76. Other constituents are the same as those in the first embodiment, and are thus given the same reference signs as in FIGS. 1 to 3 to omit description thereof.

Figure 5:
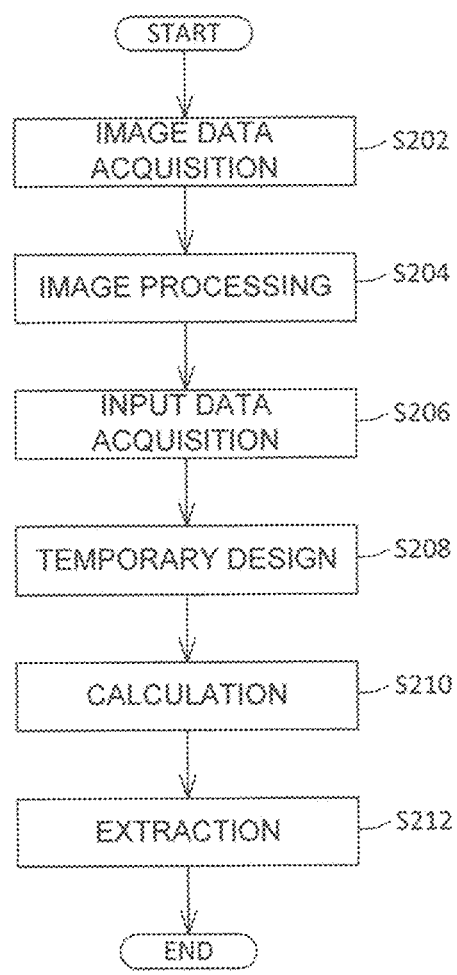
FIG. 5 is a flowchart of a design support method for photovoltaic power generation facilities that uses the design support apparatus.

Next, a construction design support method for photovoltaic power generation facilities is described that uses the construction design support apparatus 70 (see FIG. 5). The image data acquisition unit 74 first acquires the image data 72 captured from the air by the drone 54 (S202: an image data acquisition step). The image data processing unit 76 then creates the topographic data 40 and light shielding element data 28 on the site 14 for the photovoltaic power generation facility 12 on the basis of the image data 72 (S204: an image processing step). The input data acquisition unit 38 then acquires the input data created by the image data processing unit 76 (S206: an input data acquisition step). The input data acquisition unit 38 acquires the site data 16 other than the topographic data 40 and the light shielding element 28, and other input data at the input data acquisition step S206, as in the same manner as at the input data acquisition step S102 of the first embodiment. Subsequently, a temporary design step S208, a calculation step S210, and an extraction step S212 are performed as in the same manner as the temporary design step S104, the calculation step S106, and the extraction step S108 of the first embodiment. According to the second embodiment, topographic data and light shielding element data with high accuracy can be easily used.

In the first and the second embodiments, the extraction unit 54 extracts a combination of pieces of the temporary development surface data 42 (or the topographic data 40) and the temporary panel arrangement data 46 in which a difference value is maximum that is obtained by subtracting the point value of the development amount from the point value of the cumulative power generation amount. However, the extraction unit 54 may also extract a combination of pieces of the temporary development surface data 42 (or the topographic data 40) and the temporary panel arrangement data 46 in which the difference value is zero. In this case, a combination of pieces of the temporary development surface data 42 (or the topographic data 40) and the temporary panel arrangement data 46 is extracted in which the development cost is recovered by income from power sales for a predetermined period. A difference value of zero includes a case in which a difference value is within a predetermined range of numerical value close to zero.

In the first and the second embodiments, the extraction unit 54 extracts a combination of pieces of the temporary development surface data 42 (or the topographic data 40) and the temporary panel arrangement data 46 on the basis of a difference value obtained by subtracting the point value of the development amount from the point value of the cumulative power generation amount. However, the extraction unit 54 may also extract a combination of pieces of the temporary development surface data 42 (or the topographic data 40) and the temporary panel arrangement data 46 on the basis of a difference value obtained by subtracting, from the point value of the cumulative power generation amount, not only the point value of the development amount but also a panel point value corresponding to the cost of the photovoltaic panels 20, a point value of mounting equipment corresponding to the cost of mounting equipment, such as a mount, a point value of ancillary equipment corresponding to the cost of ancillary equipment, such as a DC-AC inverter, a junction box, and a current collector, and a point value of an ancillary facility corresponding to the cost of an ancillary facility, such as a fence and a power pole.

In the first and the second embodiments, the extraction unit 54 evaluates a difference value obtained by subtracting the point value of the development amount from the point value of the cumulative power generation amount. However, the extraction unit 54 may also evaluate a difference value obtained by subtracting the point value of the cumulative power generation amount from the point value of the development amount. In this case, the extraction unit 54 may extract a combination of pieces of the temporary development surface data 42 (or the topographic data 40) and the temporary panel arrangement data 46 in which the difference value is minimum (or zero). The extraction unit 54 may also extract a combination of pieces of the temporary development surface data 42 (or the topographic data 40) and the temporary panel arrangement data 46 in which the ratio of the point value of the development amount to the point value of the cumulative power generation amount (the point value of the cumulative power generation amount/the point value of the development amount) is maximum (or one). The extraction unit 54 may also extract a combination of pieces of the temporary development surface data 42 (or the topographic data 40) and the temporary panel arrangement data 46 in which the ratio of the point value of the development amount to the point value of the cumulative power generation amount (the point value of the development amount/the point value of the cumulative power generation amount) is minimum (or one). A ratio of one includes a case in which a ratio is within a predetermined range of numerical value close to one. The extraction unit 54 may also extract a combination of pieces of the temporary development surface data 42 (or the topographic data 40) and the temporary panel arrangement data 46 by individually evaluating the point value of the cumulative power generation amount and the point value of the development amount in place of a difference value between the point value of the cumulative power generation amount and the point value of the development amount or a ratio of the point value of the cumulative power generation amount to the point value of the development amount. For example, the extraction unit 54 may also extract a combination of pieces of the temporary development surface data 42 (or the topographic data 40) and the temporary panel arrangement data 46 in which the point value of the development amount is minimum within a range in which the point value of the cumulative power generation amount is equal to or more than a predetermined reference value. The extraction unit 54 may also extract a combination of pieces of the temporary development surface data 42 (or the topographic data 40) and the temporary panel arrangement data 46 in which the maximum inclination angle of the temporary development surface data 42 (or the topographic data 40) is an upper limit of the allowable value within the range in which the point value of the cumulative power generation amount is equal to or more than a predetermined reference value and also within the range in which the point value of the development amount is equal to or less than the predetermined reference value. The extraction unit 54 may also extract a plurality of combinations of pieces of the temporary development surface data 42 (and/or the topographic data 40) and the temporary panel arrangement data 46 that match a plurality of evaluation criteria as described above.

In the first and the second embodiments, the point value of the development amount is a value corresponding to the development cost. However, the point value of the development amount may also be the amount of earth cutting and/or earth filling (the volume or the mass, for example). The point value of the development amount may also be a value obtained by multiplying the amount of earth cutting and/or earth filling by a predetermined coefficient that is not a unit price for work. Likewise, the point value of the cumulative power generation amount is a value corresponding to the income from power sales. However, the point value of the cumulative power generation amount may also be the cumulative amount of power generation. The point value of the cumulative power generation amount may also be a value obtained by multiplying the cumulative amount of power generation by a predetermined coefficient that is not a power sales unit price.

What is claimed is:

1. A construction design support apparatus for photovoltaic power generation facilities, the construction design support apparatus comprising:
   a computer, which comprises: an input data acquisition unit configured to acquire input data including site data that includes positional data and topographic data on a site for a photovoltaic power generation facility that is an object to be designed, panel specifications data that includes data on power generation performance and dimensions of photovoltaic panels used in the photovoltaic power generation facility, sun direction data showing a direction of a sun on a time-series basis in a position of the site, and development requirements data that includes at least one of a development requirement for an allowable range of an inclination angle required of the site and a development requirement for an allowable range of a degree of undulation;
   a temporary design unit configured to create a plurality of pieces of temporary development surface data by performing, on the topographic data, processing equivalent to earth cutting and earth filling so as to satisfy the development requirements, and to create temporary panel arrangement data on the photovoltaic panels for each piece of the temporary development surface data;
   a calculation unit configured to calculate a point value of a development amount corresponding to amounts of earth cutting and earth filling for each piece of the temporary development surface data, and to calculate a point value of a cumulative power generation amount corresponding to a cumulative amount of power generated for a predetermined period for each piece of the temporary panel arrangement data; and
   an extraction unit configured to extract a combination of the temporary development surface data and the temporary panel arrangement data in which the point value of the development amount and the point value of the cumulative power generation amount match a predetermined evaluation condition.

2. The construction design support apparatus for photovoltaic power generation facilities according to claim 1, wherein the point value of the development amount is a value corresponding to a development cost, the point value of the cumulative power generation amount is a value corresponding to an income from power sales, and the extraction unit extracts a combination of the temporary development surface data and the temporary panel arrangement data in which a difference value is maximum that is obtained by subtracting the point value of the development amount from the point value of the cumulative power generation amount.

3. The construction design support apparatus for photovoltaic power generation facilities according to claim 1, wherein the point value of the development amount is a value corresponding to a development cost, the point value of the cumulative power generation amount is a value corresponding to an income from power sales, and the extraction unit extracts a combination of the temporary development surface data and the temporary panel arrangement data in which a difference value is zero that is obtained by subtracting the point value of the development amount from the point value of the cumulative power generation amount.

4. The construction design support apparatus for photovoltaic power generation facilities according to claim 1, further comprising:
- an image data acquisition unit configured to acquire image data on the site for the photovoltaic power generation facility; and
- an image data processing unit configured to create topographic data on the site for the photovoltaic power generation facility, based on the image data, wherein
- the input data acquisition unit is configured to acquire the topographic data created by the image data processing unit.

5. A construction design support method for photovoltaic power generation facilities, the construction design support method comprising the steps of:
- input data acquisition in which an input data acquisition unit acquires input data including site data that includes positional data and topographic data on a site for a photovoltaic power generation facility that is an object to be designed, panel specifications data that includes data on power generation performance and dimensions of photovoltaic panels used in the photovoltaic power generation facility, sun direction data showing a direction of a sun on a time-series basis in a position of the site, and development requirements data that includes at least one of a development requirement for an allowable range of an inclination angle required of the site and a development requirement for an allowable range of a degree of undulation;
- temporary design in which a temporary design unit creates a plurality of pieces of temporary development surface data by performing, on the topographic data, processing equivalent to earth cutting and earth filling so as to satisfy the development requirements, and creates temporary panel arrangement data on the photovoltaic panels for each piece of the temporary development surface data;
- calculation in which a calculation unit calculates a point value of a development amount corresponding to amounts of earth cutting and earth filling for each piece of the temporary development surface data, and calculates a point value of a cumulative power generation amount corresponding to a cumulative amount of power generated for a predetermined period for each piece of the temporary panel arrangement data; and
- extraction in which an extraction unit extracts a combination of the temporary development surface data and the temporary panel arrangement data in which the point value of the development amount and the point value of the cumulative power generation amount match a predetermined evaluation condition.

* * * * *